United States Patent
Lin

(10) Patent No.: US 9,960,146 B1
(45) Date of Patent: May 1, 2018

(54) SEMICONDUCTOR STRUCTURE AND METHOD FOR FORMING THE SAME

(71) Applicant: NANYA TECHNOLOGY CORPORATION, New Taipei (TW)

(72) Inventor: Po-Chun Lin, Changhua County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days. days.

(21) Appl. No.: 15/462,906

(22) Filed: Mar. 19, 2017

(51) Int. Cl.
- *H01L 23/02* (2006.01)
- *H01L 21/00* (2006.01)
- *H01L 25/065* (2006.01)
- *H01L 23/498* (2006.01)
- *H01L 23/00* (2006.01)

(52) U.S. Cl.
CPC .... *H01L 25/0652* (2013.01); *H01L 23/49816* (2013.01); *H01L 23/49838* (2013.01); *H01L 24/06* (2013.01); *H01L 24/14* (2013.01); *H01L 24/81* (2013.01); *H01L 25/0657* (2013.01); *H01L 2224/0231* (2013.01); *H01L 2224/02371* (2013.01); *H01L 2224/02373* (2013.01); *H01L 2224/02381* (2013.01); *H01L 2224/0401* (2013.01)

(58) Field of Classification Search
CPC .............. H01L 23/481; H01L 25/0652; H01L 23/49816; H01L 23/49838; H01L 24/06; H01L 24/14; H01L 24/81; H01L 23/3128; H01L 25/0657
See application file for complete search history.

(56) References Cited

U.S. PATENT DOCUMENTS

| | | | |
|---|---|---|---|
| 6,204,562 B1 | 3/2001 | Ho et al. | |
| 6,740,981 B2* | 5/2004 | Hosomi | G11C 8/12 |
| | | | 257/686 |
| 7,786,594 B2 | 8/2010 | Lee et al. | |
| 7,824,959 B2 | 11/2010 | Lee et al. | |
| 8,278,766 B2 | 10/2012 | Lee et al. | |
| 9,368,672 B2* | 6/2016 | Thompson | H01L 33/005 |
| 2002/0074637 A1* | 6/2002 | McFarland | H01L 21/563 |
| | | | 257/686 |
| 2005/0056922 A1* | 3/2005 | Vasoya | H01L 23/14 |
| | | | 257/686 |
| 2009/0212407 A1* | 8/2009 | Foster | B81B 7/0006 |
| | | | 257/686 |

(Continued)

*Primary Examiner* — Alonzo Chambliss
(74) *Attorney, Agent, or Firm* — CKC & Partners Co., Ltd.

(57) ABSTRACT

A semiconductor structure includes a first stacking interposer. The first stacking interposer includes a first interposer having a first surface and a second surface opposite thereto; a plurality of first conductive pillars penetrating through the first interposer from the first surface to the second surface; a plurality of first bumps disposed at a side of the first surface of the first interposer and electrically connected to the first conductive pillars; and a first redistribution layer disposed on the second surface of the first interposer. The first surface has a clearance region where is free of the first bumps. A first chip is disposed over the first redistribution layer. The first chip is aligned with the clearance region of the first surface of the first interposer in a direction perpendicular to the first surface. A plurality of second bumps interconnecting the first redistribution layer with the first chip.

20 Claims, 9 Drawing Sheets

(56) References Cited

U.S. PATENT DOCUMENTS

| | | | | |
|---|---|---|---|---|
| 2010/0127372 A1* | 5/2010 | Holland | ............... | H01L 24/14 |
| | | | | 257/685 |
| 2013/0313720 A1* | 11/2013 | Zhang | ............... | H01L 21/486 |
| | | | | 257/774 |
| 2014/0110860 A1* | 4/2014 | Choi | ............... | H01L 24/29 |
| | | | | 257/774 |
| 2015/0287672 A1* | 10/2015 | Yazdani | ............... | H01L 21/486 |
| | | | | 257/414 |

* cited by examiner

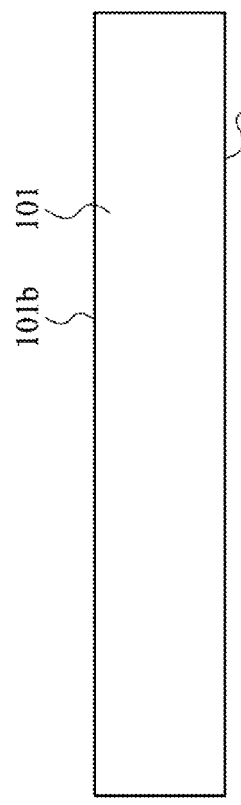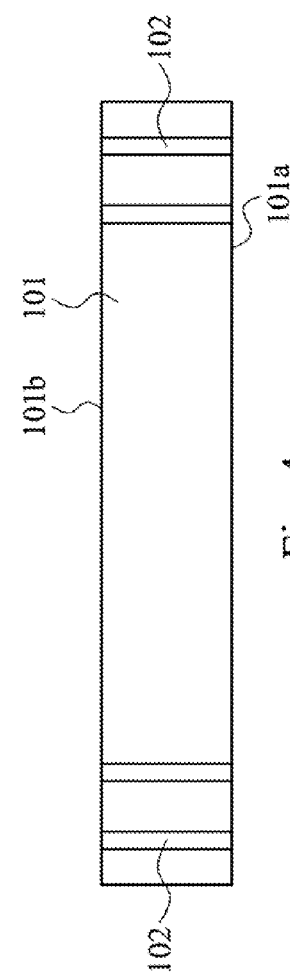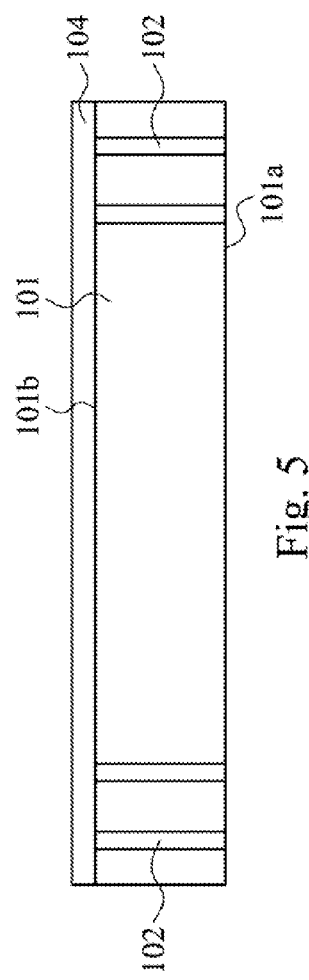

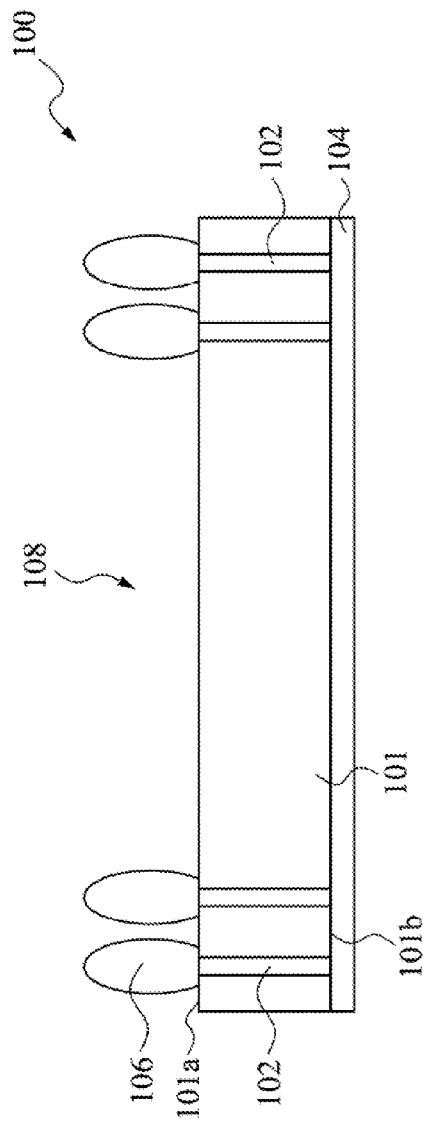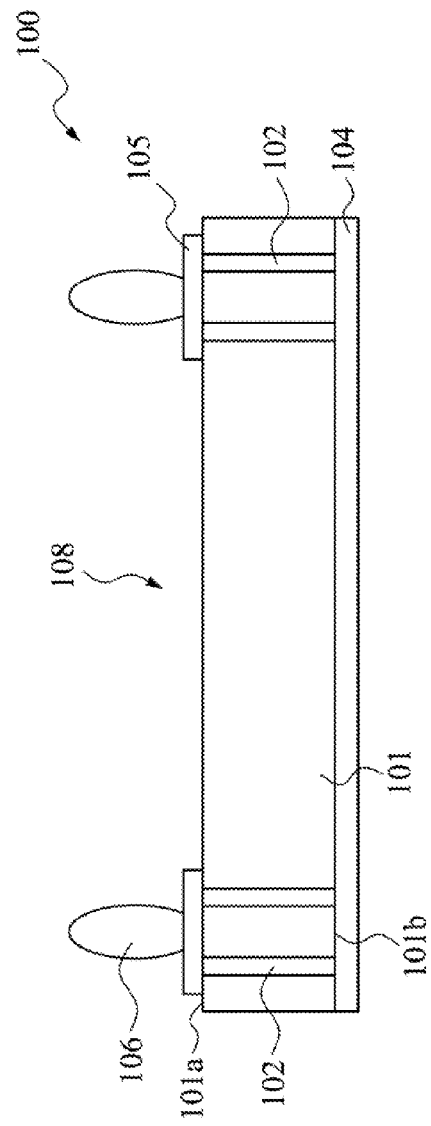

SEMICONDUCTOR STRUCTURE AND METHOD FOR FORMING THE SAME

BACKGROUND

Field of Invention

The present invention relates to a semiconductor structure and method for forming the same.

Description of Related Art

In order to improve performance and functionality of integrated circuits (ICs), three-dimensional (3D) stacking technologies have been proposed. Through silicon vias (TSVs) are generally created in the chips to fabricate the 3D stacking structure. However, in conventional 3D stacking technologies, the functional area and/or the effective area of the chip is decreased due to the formation of the TSVs. Further, heat between adjacent chips cannot be effectively dissipated. In addition, the formation of the TSVs in the circuit area of the chip also faces several challenges in the industry. Therefore, traditional 3D stacking techniques are not satisfied in all aspects.

SUMMARY

According to one aspect of the present disclosure, a semiconductor structure is provided. The semiconductor structure includes a first stacking interposer, a first chip, and a plurality of second bumps. The first stacking interposer includes a first interposer, a plurality of first conductive pillars, a plurality of first bumps, and a first redistribution layer. The first interposer has a first surface and a second surface opposite thereto. The first conductive pillars penetrate through the first interposer from the first surface to the second surface. The first bumps are disposed at a side of the first surface of the first interposer, and electrically connected to the first conductive pillars. The first surface has a clearance region where is free of the first bumps. The first redistribution layer is disposed on the second surface of the first interposer. The first chip is disposed over the first redistribution layer, in which the first chip is aligned with the clearance region of the first surface of the first interposer in a direction perpendicular to the first surface. The plurality of second bumps interconnects the first redistribution layer with the first chip.

In some embodiments of the present disclosure, the semiconductor structure further includes a carrier substrate, a second chip, and a plurality of third bumps. The first bumps of the first stacking interposer are disposed on the carrier substrate. The second chip is disposed on the carrier substrate such that the second chip is between the carrier substrate and the first interposer. The second chip is aligned with the clearance region of the first surface of the first interposer and a spacing is present between the clearance region and the second chip.

In some embodiments of the present disclosure, the semiconductor structure further includes a second stacking interposer and a third chip. The second stacking interposer is disposed over the first stacking interposer and includes a second interposer, a plurality of second conductive pillars, a plurality of fourth bumps, and a second redistribution layer. The second interposer has a first surface and a second surface opposite thereto. The second conductive pillars penetrate through the second interposer. The fourth bumps are disposed at a side of the first surface of the second interposer and interconnecting the first redistribution layer with the second conductive pillars. The second redistribution layer is disposed on the second surface of the second interposer. The third chip is disposed over the second redistribution layer, in which the third chip is aligned with the clearance region of the first surface of the first interposer in the direction perpendicular to the first surface.

In some embodiments of the present disclosure, the first and the second conductive pillars have a same distribution such that each of the first conductive pillars is aligned with each of the second conductive pillars in the direction perpendicular to the first surface of the first interposer.

In some embodiments of the present disclosure, the first stacking interposer further includes a conductive pad extending on the first surface and bridging two adjacent ones of the first conductive pillars, in which one of the first bumps is equal-potentially electrically connected to the two adjacent ones of the first conductive pillars through the conductive pad.

According to one aspect of the present disclosure, a semiconductor structure is provided. The semiconductor structure includes a first stacking interposer, a first chip, and a plurality of second bumps. The first stacking interposer includes a first interposer, a plurality of first conductive pillars, a plurality of first bumps, and a first redistribution layer. The first interposer has a first surface and a second surface opposite thereto. The first conductive pillars penetrate through the first interposer from the first surface to the second surface. The first bumps are disposed at a side of the first surface of the first interposer and electrically connected to the first conductive pillars, in which the first surface has a clearance region where is free of the first bumps. The first redistribution layer is disposed on the second surface of the first interposer. The first chip has a first surface and a second surface opposite thereto, and the second surface of the first chip is fastened to the clearance region of the first surface of the first interposer. The second bumps are disposed on the first surface of the first chip.

In some embodiments of the present disclosure, each first bump has a first bonding end and each second bump has a second bonding end, and the first bonding ends of the first bumps are substantially leveled with the second bonding end of the second bumps.

In some embodiments of the present disclosure, each first bump has a first height, each second bump has a second height, and the first chip has a thickness. The first height of the first bump substantially equals to a sum of the thickness of the first chip and the second height of the second bump In some embodiments of the present disclosure, the semiconductor structure further includes a carrier substrate, in which the first bumps of the first stacking interposer and the second bumps are bonded to the carrier substrate.

In some embodiments of the present disclosure, the semiconductor structure further includes a second stacking interposer, a second chip, and a plurality of fourth bumps. The second stacking interposer is disposed over the first stacking interposer, and includes a second interposer, a plurality of second conductive pillars, a plurality of third bumps, and a second redistribution layer. The second interposer has a first surface and a second surface opposite thereto. The second conductive pillars penetrate through the second interposer. The third bumps are disposed at a side of the first surface of the second interposer and interconnecting the first redistribution layer with the second conductive pillars. The second redistribution layer is disposed on the second surface of the second interposer. The second chip is disposed on the first surface of the second interposer. The fourth bumps are disposed on the second chip, in which the fourth bumps interconnect the second chip with the first redistribution layer of the first stacking interposer.

According to one aspect of the present disclosure, a method of forming a semiconductor structure is provided. The method includes the operations described below. A first stacking interposer is firstly formed. The formation of the first stacking interposer includes the following steps: (i) providing a second interposer having a first surface and a second surface; (ii) forming a plurality of first conductive pillars penetrating through the first interposer from the first surface to the second surface; (iii) forming a first redistribution layer on the second surface of the first interposer; and (iv) forming a plurality of first bumps at a side of the first surface of the first interposer, in which the first bumps are electrically connected to the first conductive pillars, and the first surface has a clearance region where is free of the first bumps. Subsequently, a first chip is provided, in which the first chip includes a plurality of second bumps. Thereafter, the second bumps of the first chip is bonded to the first redistribution layer on the second surface of the first interposer, in which the first chip is aligned with the clearance region of the first surface of the first interposer in a direction perpendicular to the first surface of the first interposer.

In some embodiments of the present disclosure, the method further includes the steps described below. A precursor substrate is provided. The precursor substrate includes a carrier substrate, a second chip, and a plurality of third bumps interconnecting the second chip with the carrier substrate. Thereafter, the first bumps of the first stacking interposer are bonded to the carrier substrate such that the second chip is between the carrier substrate and the first interposer, in which the second chip is aligned with the clearance region of the first surface of the first interposer and a spacing is present between the clearance region and the second chip.

In some embodiments of the present disclosure, the method further includes the operations described below. A second stacking interposer is formed. The formation of the second stacking interposer includes the following steps: providing a second interposer having a first surface and a second surface; forming a plurality of second conductive pillars penetrating through the second interposer; forming a second redistribution layer on the second surface of the second interposer; and forming a plurality of fourth bumps at a side of the first surface of the second interposer and electrically connected to the second conductive pillars. Subsequently, a third chip is disposed over the second redistribution layer, in which the third chip is aligned with the clearance region of the first surface of the first interposer in the direction perpendicular to the first surface. Thereafter, the fourth bumps of the second stacking interposer are bonded to the first redistribution layer of the first stacking interposer.

In some embodiments of the present disclosure, the first and second conductive pillars have a same distribution such that each of the first conductive pillars is aligned with each of the second conductive pillars in the direction perpendicular to the first surface of the first interposer.

In some embodiments of the present disclosure, the clearance region is surrounded by the first bumps, and the first chip has an area that is less than an area of the clearance region.

The present disclosure provides another method of forming a semiconductor structure according to yet some embodiments. The method includes the operations described below. A first stacking interposer is formed. The formation of the first stacking interposer includes the following steps: providing a first interposer having a first surface and a second surface; forming a plurality of first conductive pillars penetrating through the first interposer from the first surface to the second surface; forming a first redistribution layer on the second surface of the first interposer; and forming a plurality of first bumps at a side of the first surface of the first interposer and electrically connected to the first conductive pillars, in which the first surface has a clearance region where is free of the first bumps. Subsequently, a first chip is provided, in which the first chip includes a first surface, a second surface opposite thereto, and a plurality of second bumps on the first surface of the first chip. Thereafter, the second surface of the first chip is bonded to the clearance region of the first surface of the first interposer.

In some embodiments of the present disclosure, each first bump has a first bonding end and each second bump has a second bonding end, and the first bonding ends of the first bumps are substantially leveled with the second bonding end of the second bumps.

In some embodiments of the present disclosure, the method further includes bonding the first bumps of the first stacking interposer and the second bumps of the first chip to a carrier substrate.

In some embodiments of the present disclosure, the method further includes the operations described below. A second stacking interposer is formed. The formation of the second stacking interposer includes the following steps: providing a second interposer having a first surface and a second surface; forming a plurality of second conductive pillars penetrating through the second interposer; forming a second redistribution layer on the second surface of the second interposer; forming a plurality of third bumps at a side of the first surface of the second interposer and electrically connected to the second conductive pillars, in which the first surface of the second interposer has a clearance region where is free of the third bumps; and providing a second chip comprising a first surface, a second surface opposite thereto, and a plurality of fourth bumps on the first surface of the second chip. Subsequently, the second surface of the second chip is fastened to the clearance region of the first surface of the second interposer. Thereafter, the third bumps of the second stacking interposer and the fourth bumps of the second chip are bonded to the first redistribution layer of the first stacking interposer.

In some embodiments of the present disclosure, after forming the first redistribution layer, the method further includes forming a conductive pad extending on the first surface of the first interposer and bridging two adjacent ones of the first conductive pillars.

BRIEF DESCRIPTION OF THE DRAWINGS

The invention can be more fully understood by reading the following detailed description of the embodiment, with reference made to the accompanying drawings as follows:

FIG. 3 to FIG. 10 are cross-sectional views illustrating various process stages of forming the semiconductor structure, in accordance with some embodiments.

DETAILED DESCRIPTION

Figure 1:
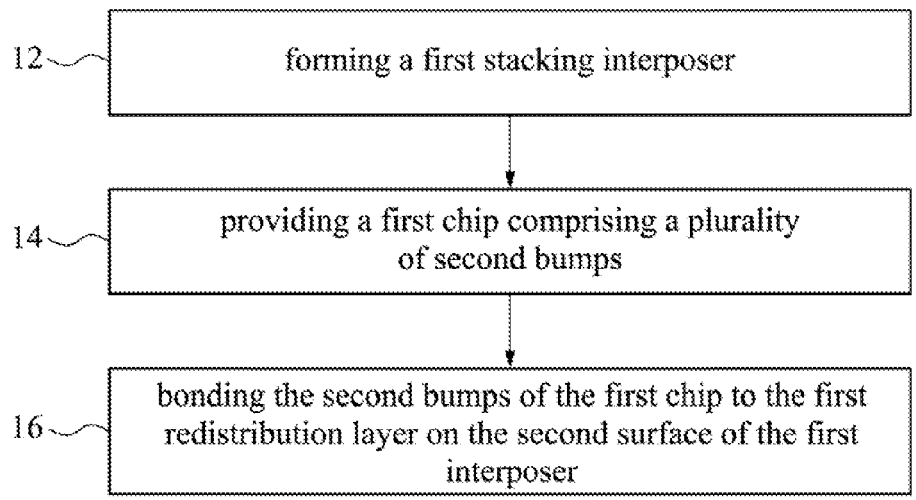
FIG. 1 and FIG. 2 illustrate a flow chart of a method of forming the semiconductor structure, in accordance with various embodiments.

Reference will now be made in detail to the present embodiments of the invention, examples of which are illustrated in the accompanying drawings. Wherever possible, the same reference numbers are used in the drawings and the description to refer to the same or like parts.

FIG. 1 shows a flow chart illustrating a method 10 of manufacturing a semiconductor structure according to some embodiments of the present disclosure. The method 10 of forming the semiconductor structure includes operation 12, operation 14, and operation 16.

In operation 12, a first stacking interposer is formed. According to some embodiment, operation 12 may be further understood with reference to FIG. 3 to FIG. 6A, which are cross-sectional views illustrating various process stages of forming the first stacking interposer. In some embodiments, the formation of the first stacking interposer includes the steps described below. With reference to FIG. 3, a first interposer 101 having a first surface 101a and a second surface 101b is provided. Various materials may be used as the material constituting the first interposer 101. For example, the first interposer 101 may be a silicon (Si) substrate. One reason for using Si as the material of the first interposer 101 is that it has the same material as the semiconductor chip to be mounted thereon. Therefore, the coefficients of thermal expansion (CTEs) of the first interposer 101 may be approximately equal to that of the semiconductor chip, thereby preventing several disadvantages such as a warp or a twist due to the difference in thermal shrinkage there between.

Next, with reference to FIG. 4, a plurality of first conductive pillars 102 are formed in the first interposer 101. The first conductive pillars 102 penetrate through the first interposer 101 from the first surface 101a to the second surface 101b. To be specific, a series of processes are performed on the interposer to form the first conductive pillars 102. For example, pluralities of through vias are formed in the interposer, and thereafter a conductive material is applied to fill the through vias. In some embodiment, the through vias may be formed by appropriate processes such as photolithography-etching processes, machine drilling processes and laser drilling processes. In some embodiment, the through vias may be filled by sputtering techniques, evaporating techniques, electroplating techniques, or electroless plating, for example. In some embodiment, illustrative examples of the materials of the first conductive pillars 102 include aluminum, copper, nickel or other suitable conductive materials. However, the present disclosure is not limited thereto.

With reference to FIG. 5, a first redistribution layer 104 is formed on the second surface 101b of the first interposer 101. The first redistribution layer 104 is in contact with at least one of the first conductive pillars 102. To be specific, the first redistribution layer 104 may include aluminum, copper, nickel, or other suitable metal materials. The first redistribution layer 104 may be formed on the second surface 101b of the first interposer 101 by sputtering, evaporation, or other suitable processes. The first redistribution layer 104 can serve as a shielding cap of electromagnetic Interference (EMI) for the chips being covered, according to some embodiments.

Next, with reference to FIG. 6A, a plurality of first bumps 106 are disposed at a side of the first surface 101a of the first interposer 101. In addition, the first bumps 106 are electrically connected to the first conductive pillars 102. The first surface 101a has a clearance region 108 where is free of the first bumps 106. In some embodiment, the clearance region 108 of the first surface 101a is surrounded by the first bumps 106. The first bumps 106 may be solder balls or other structures known in the art, and the first bumps 106 may be spherical, oval, square or rectangular in shape, but not limited thereto. After forming the first bumps 106, a first stacking interposer 100 is obtained. With reference to FIG. 6B, a conductive pad 105 may be optionally formed prior to the formation of the first bumps 106. The conductive pad 105 extends on the first surface 101a of the first interposer 101 and bridges two adjacent ones of the first conductive pillars 102. After forming the conductive pad 105, the first bumps 106 are disposed thereon. In practice, the conductive pad 105 may include electrically conductive material such as aluminum, copper or similar materials.

Figure 7:
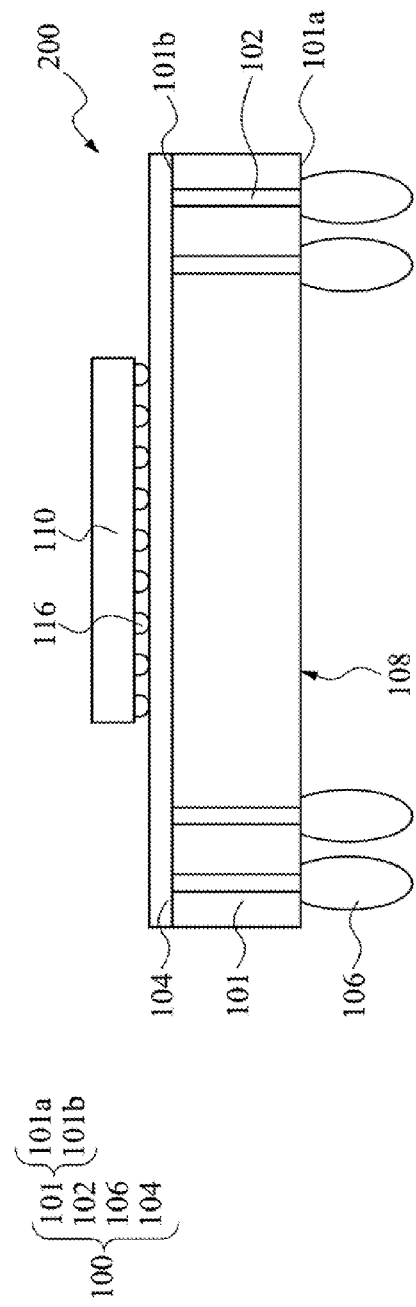

Referring back to FIG. 1, method 10 proceeds to operation 14 by providing a first chip comprising a plurality of second bumps. As illustrated in FIG. 7, a first chip 110 including a plurality of second bumps 116 is provided. It is noted that the first chip 110 is free of any through via passing through the first chip 110. In some embodiment, the first chip 110 can be, but not limited to, a dynamic random access memory (DRAM), a static random access memory (SRAM), a read only memory (ROM), a logic circuit, a flash memory, an application specific integrated circuit (ASIC), or an analog circuit. In some embodiment, the second bumps 116 of the first chip 110 may be solder balls or other structures known in the art, and second bumps 116 may be spherical, oval, square or rectangular in shape, but not limited thereto.

Referring to operation 16 in FIG. 1 and FIG. 7 continuously, the second bumps 116 of the first chip 110 are bonded to the first redistribution layer 104 on the second surface 101b of the first interposer 101, thereby forming a semiconductor structure 200. Specifically, the first chip 110 is aligned with the clearance region 108 of the first surface 101a of the first interposer 101 in a direction perpendicular to the first surface 101a of the first interposer 101. As mentioned above, the clearance region 108 is free of any bumps, and is surrounded by the first bumps 106. In examples, the area of the first chip 110 is less than the area of the clearance region 108 such that the first chip 110 may be located within the clearance region 108 when viewed in the direction perpendicular to the first surface 101a. It is noted that the diameter of each first bump 106 is greater than the diameter of each second bump 116.

Figure 8:
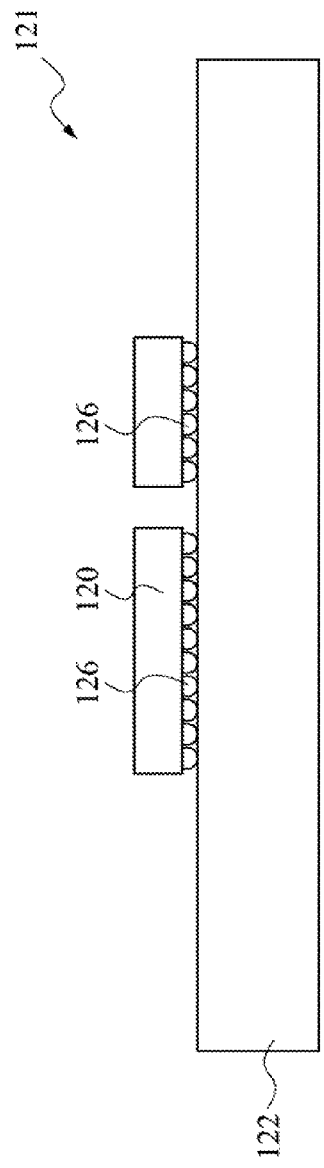

The method 10 may further include additional operations or processes. With reference to FIG. 8, a precursor substrate 121 may be provided before, during, or after the operation 16. The precursor substrate 121 includes a carrier substrate 122, at least one second chip 120, and a plurality of third bumps 126 interconnecting the second chip 120 with the carrier substrate 122. In some embodiment, the carrier substrate 122 may be a printed circuit board (PCB), a semiconductor substrate or other substrates known in the art. Illustrative examples of the materials of the PCB include glass fiber, epoxy resins, phenolic resins, polyimide (PI), and other suitable material, for example. Illustrative examples of the materials of the semiconductor substrate include silicon and a compound semiconductor, such as silicon carbide, gallium arsenide, indium arsenide, and indium phosphide. The semiconductor substrate may include various doping configurations, depending on the requirements known in the art (e.g., p-type substrate or n-type substrate). The second chip 120 may include a functional module the same as the first chip 110. For example, the second chip 120 may include a dynamic random access memory (DRAM), a static random access memory (SRAM), a read only memory (ROM), a logic circuit, a flash memory, an application specific integrated circuit (ASIC), or an analog circuit, but not limited thereto. The third bumps 126 may be solder balls or other structures known in the art, and the third bumps 126 may be spherical, oval, square or rectangular in shape, but not limited thereto. As shown in FIG. 8, the precursor substrate 121 may include a monolayer Flip-Chip package comprised of the second chip 120 and the third bumps 126.

Figure 9:
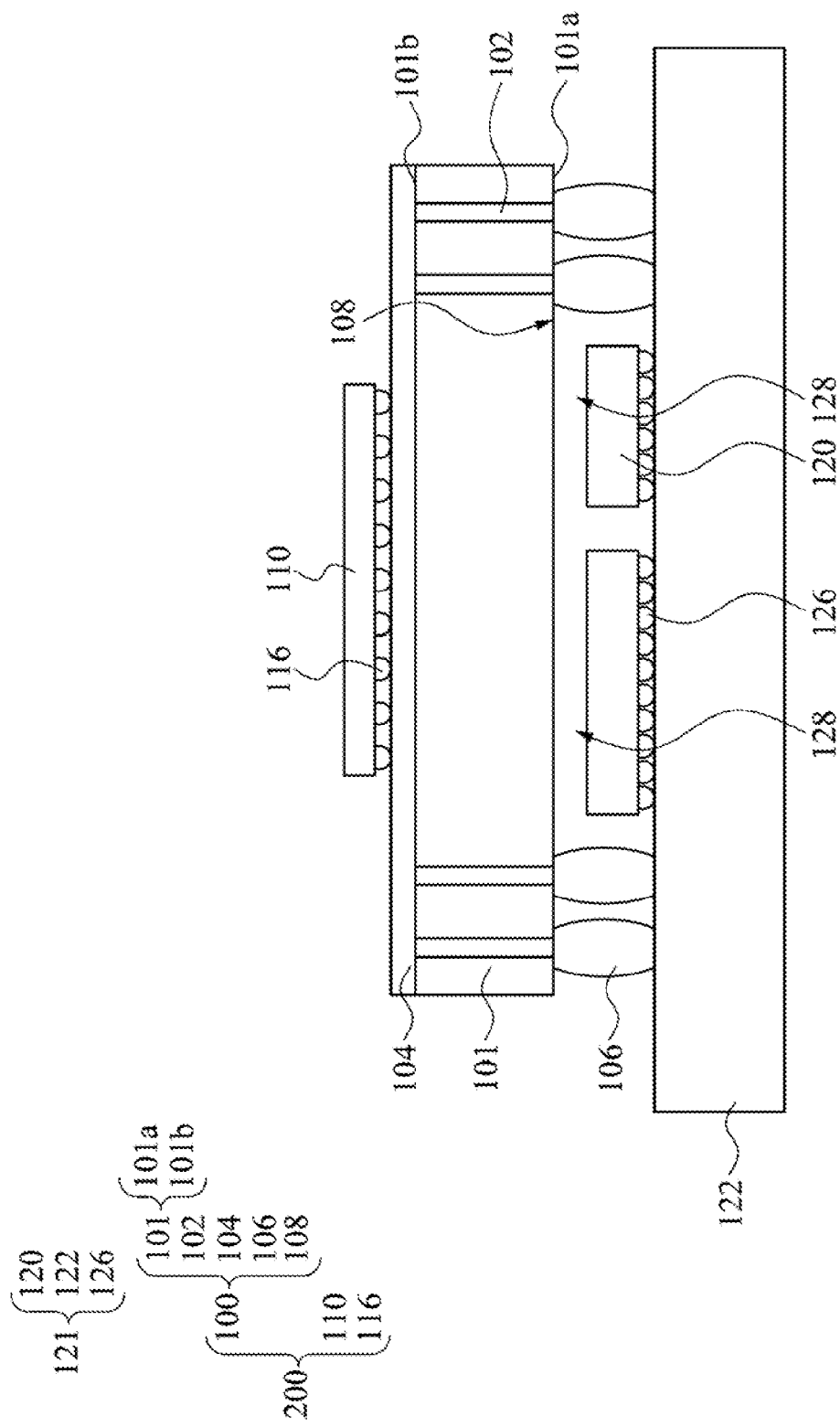

With reference to FIG. 9, the semiconductor structure 200 is bonded to the precursor substrate 121. Specifically, the first bumps 106 of the first stacking interposer 100 are bonded to the carrier substrate 122 of the precursor substrate 121 such that the second chip 120 is between the carrier substrate 122 and the first interposer 101. More specifically, the second chip 120 is aligned with the clearance region 108 of the first surface 101a of the first interposer 101, and a spacing 128 is present between the clearance region 108 and the second chip 120. As shown in FIG. 9, the obtained semiconductor structure includes a double-layered Flip-Chip package.

Figure 10:
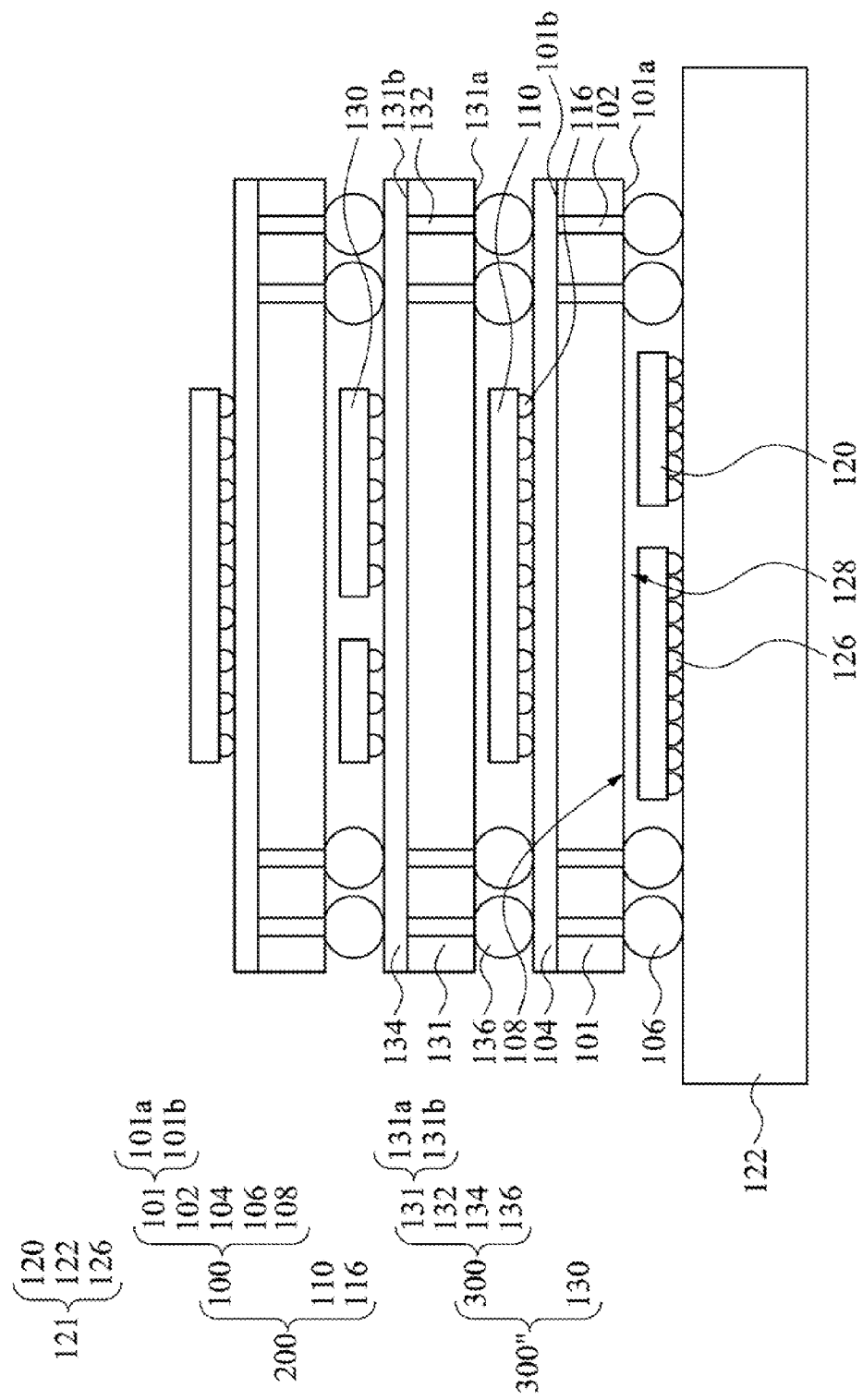

With reference to FIG. 10, the method 10 may further include forming a semiconductor structure 300" over the semiconductor structure 200. In some embodiments, the semiconductor structure 300" is the same as or similar in structure to the semiconductor structure 200. Further, the semiconductor structure 300" may be formed by the same method as forming the semiconductor structure 200. Briefly, the semiconductor structure 300" includes a second stacking interposer 300, and a third chip 130. The second stacking interposer 300 includes a second interposer 131, a plurality of second conductive pillars 132, a second redistribution layer 134, and a plurality of fourth bumps 136. To be specific, the second interposer 131 has a first surface 131a and a second surface 131b. The second conductive pillars 132 penetrate through the second interposer 131. The second redistribution layer 134 is disposed on the second surface 131b of the second interposer 131. The fourth bumps 136 are disposed at the side of the first surface 131a of the second interposer 131 and electrically connected to the second conductive pillars 132. The third chip 130 is disposed over the second redistribution layer 134, and is aligned with the clearance region 108 of the first surface 101a of the first interposer 101 in the direction perpendicular to the first surface 101a. The fourth bumps 136 of the second stacking interposer 300 are bonded to the first redistribution layer 104 of the first stacking interposer 100.

In some embodiment, another semiconductor structure 200 may be stacked over the semiconductor structure 300".

According to another aspect of the present disclosure, a semiconductor structure 200 is provided. FIG. 7 shows a semiconductor structure 200 according to some embodiments of the present disclosure. The semiconductor structure 200 includes a first stacking interposer 100, a first chip 110 and a plurality of second bumps 116. The first stacking interposer 100 includes a first interposer 101, a plurality of first conductive pillars 102, a plurality of first bumps 106, and a first redistribution layer 104. The first interposer 101 has a first surface 101a and a second surface 101b opposite thereto. The first conductive pillars 102 penetrate through the first interposer 101 from the first surface 101a to the second surface 101b. The first bumps 106 are disposed at the side of the first surface 101a of the first interposer 101 and electrically connected to the first conductive pillars 102. The first redistribution layer 104 is disposed on the second surface 101b of the first interposer 101. In some embodiments, the first surface 101a of the first interposer 101 has a clearance region 108 where is free of the first bumps 106.

The first chip 110 may be disposed over the first redistribution layer 104, and the second bumps 116 interconnect the first redistribution layer 104 with the first chip 110. The first chip 110 is aligned with the clearance region 108 of the first surface 101a of the first interposer 101 in a direction perpendicular to the first surface 101a. It is noted that the first chip 110 is free of any through via passing through the first chip 110.

In some embodiments, the first stacking interposer 100 further includes a conductive pad 105, as illustrated in FIG. 6B. The conductive pad 105 extends on the first surface 101a and bridges two adjacent ones of the first conductive pillars 102. At least one of the first bumps 106 is equal-potentially electrically connected to the two adjacent first conductive pillars 102 through the conductive pad 105. In some examples, the conductive pad 105 may include electrically conductive material such as aluminum, copper or similar materials.

FIG. 9 illustrates another semiconductor structure according to yet some embodiments of the present disclosure. The semiconductor structure depicted in FIG. 9 includes a precursor substrate 121 and a semiconductor structure 200 on the precursor substrate 121. The precursor substrate 121 includes a carrier substrate 122, one or more second chips 120, and a plurality of third bumps 126. The second chip 120 is disposed on the carrier substrate 122, and the third bumps 126 interconnect the second chip 120 with the carrier substrate 122. The first bumps 106 of the semiconductor structure 200 are bonded onto the carrier substrate 122 so that the second chip 120 is between the carrier substrate 122 and the first interposer 101. To be specific, the second chip 120 is aligned with the clearance region 108 on the first surface 101a of the first interposer 101 and a spacing 128 is present between the clearance region 108 and the second chip 120. Furthermore, referring to FIG. 10, other semiconductor structures such as semiconductor structures 300" and/or other structures may be added to the structure depicted in FIG. 9.

Figure 2:
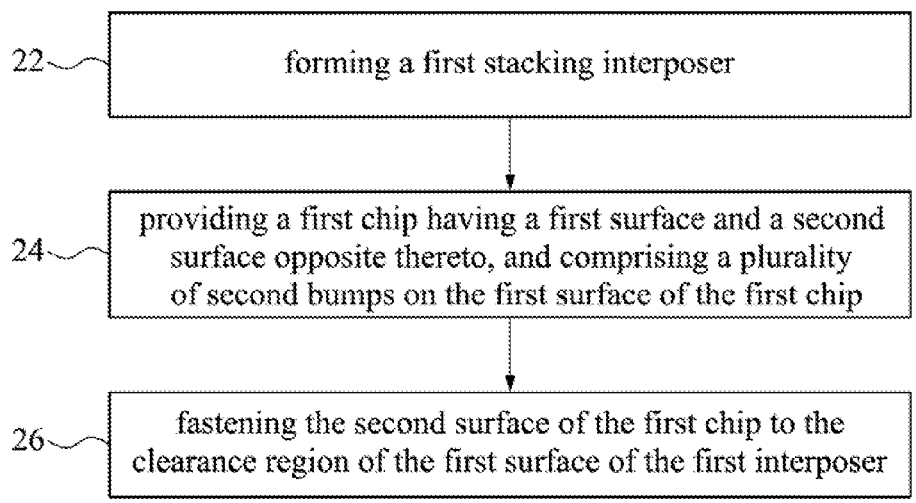

The present invention provides another method for forming a semiconductor structure according to yet some embodiments. Referring to FIG. 2, it shows a flow chart illustrating a method 20 of manufacturing a semiconductor structure according to some embodiments. The method 20 includes operation 22, operation 24, and operation 26.

In operation 22, a first stacking interposer is formed. Operation 22 may be implemented by approaches the same as operation 12 of method 10. The embodiments of operation 22 may be the same as these described above in connection with FIG. 3 to FIG. 6B. Therefore, the detailed descriptions are omitted to avoid repetition.

Figure 11:
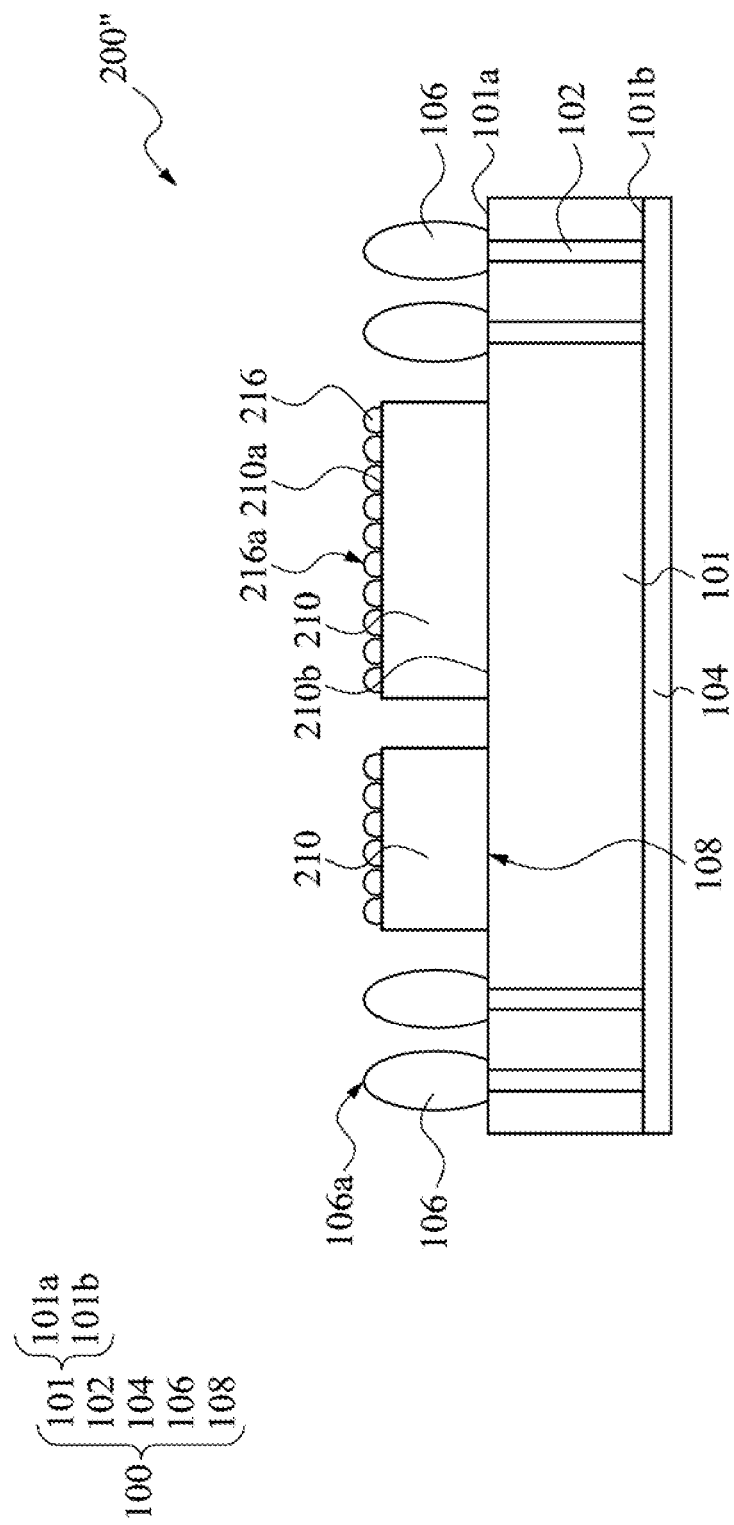
FIG. 11 to FIG. 13 are cross-sectional views illustrating various process stages of forming the semiconductor structure, in accordance with other embodiments.

In operation 24, a first chip is provided. With reference to FIG. 11, a first chip 210 with a first surface 210a and a second surface 210b opposite thereto is provided. The first chip 210 comprises a plurality of the second bumps 216 formed on the first surface 210a of the first chip 210, whereas the second surface 210b does not have any bumps thereon. It is noted that the first chip 210 is free of any through via passing through the first chip 210, and the diameter of each first bump 106 is greater than the diameter of each second bump 216. In some embodiments, each of the first bumps 106 has a first bonding end 106a, and each of the second bumps 216 has a second bonding end 216a. The first bonding ends 106a of the first bumps 106 are substantially leveled with the second bonding end 216a of the second bumps 216. In other words, the height of the first bump 106 substantially equals to a sum of the thickness of the first chip 210 and the height of the second bump 216.

The first chip 210 may include a functional module the same as the chips 110, 120, and/or 130 described hereinbefore.

In operation 26, the second surface of the first chip is fastened to the clearance region of the first surface of the first interposer. As shown in FIG. 11, the second surface 210b of the first chip 210 is fasten to the clearance region 108 of the first surface 101a of the first interposer 101, thereby forming a semiconductor structure 200". Specifically, the second surface 210b of the first chip 210 may be adhered to the clearance region 108 by brush-coating adhesive material on the clearance region 108 and/or the second surface 210b and followed by a pressing process.

Figure 12:
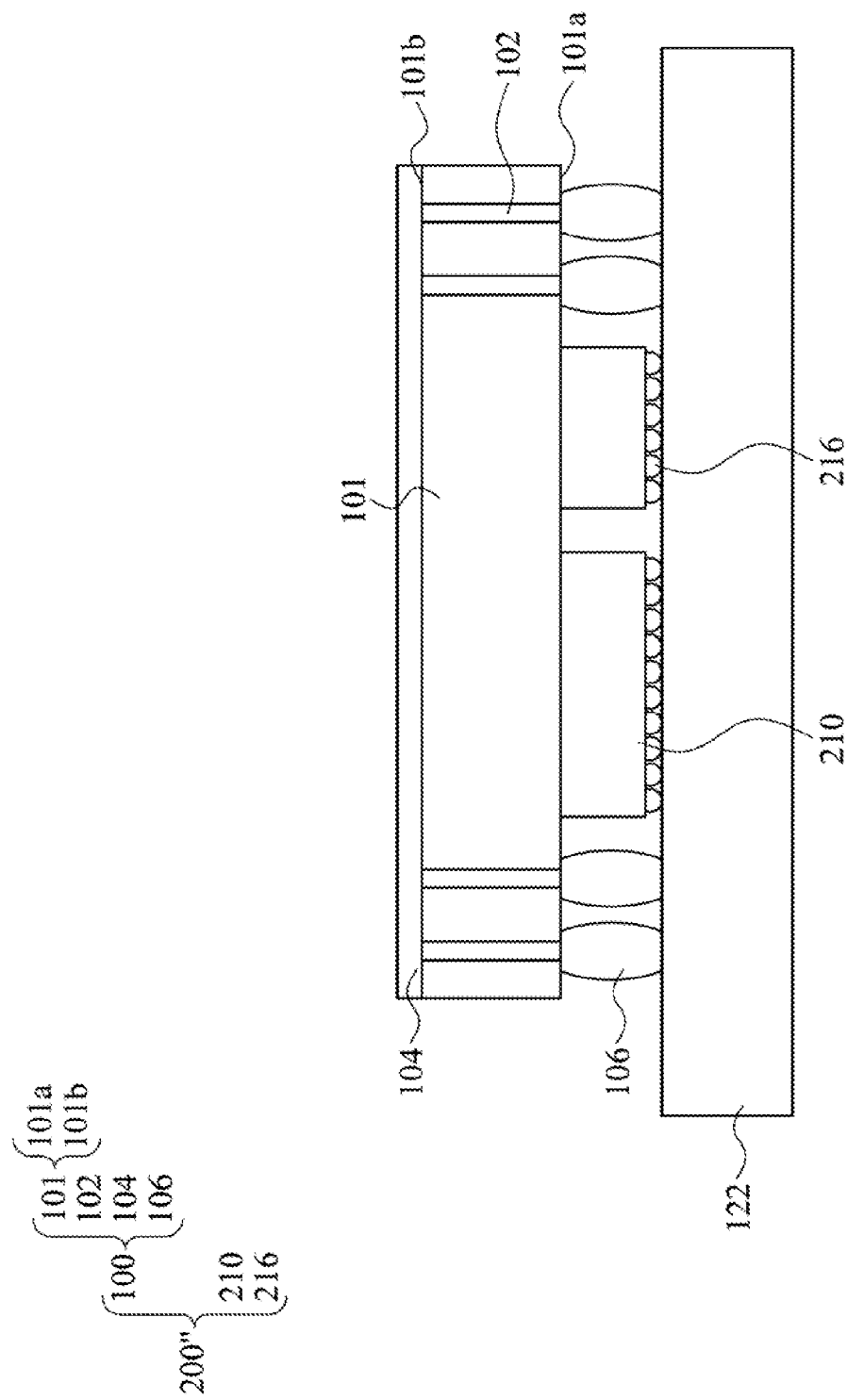

After operation 26, the method 20 may further include additional operations or processes. With reference to FIG. 12, a carrier substrate 122 may be provided before, during, or after the operation 26, and then the semiconductor structure 200" is bonded to the carrier substrate 122. To be specific, the first bumps 106 of the first stacking interposer 100 and the second bumps 216 of the first chip 210 are bonded to the carrier substrate 122.

Figure 13:
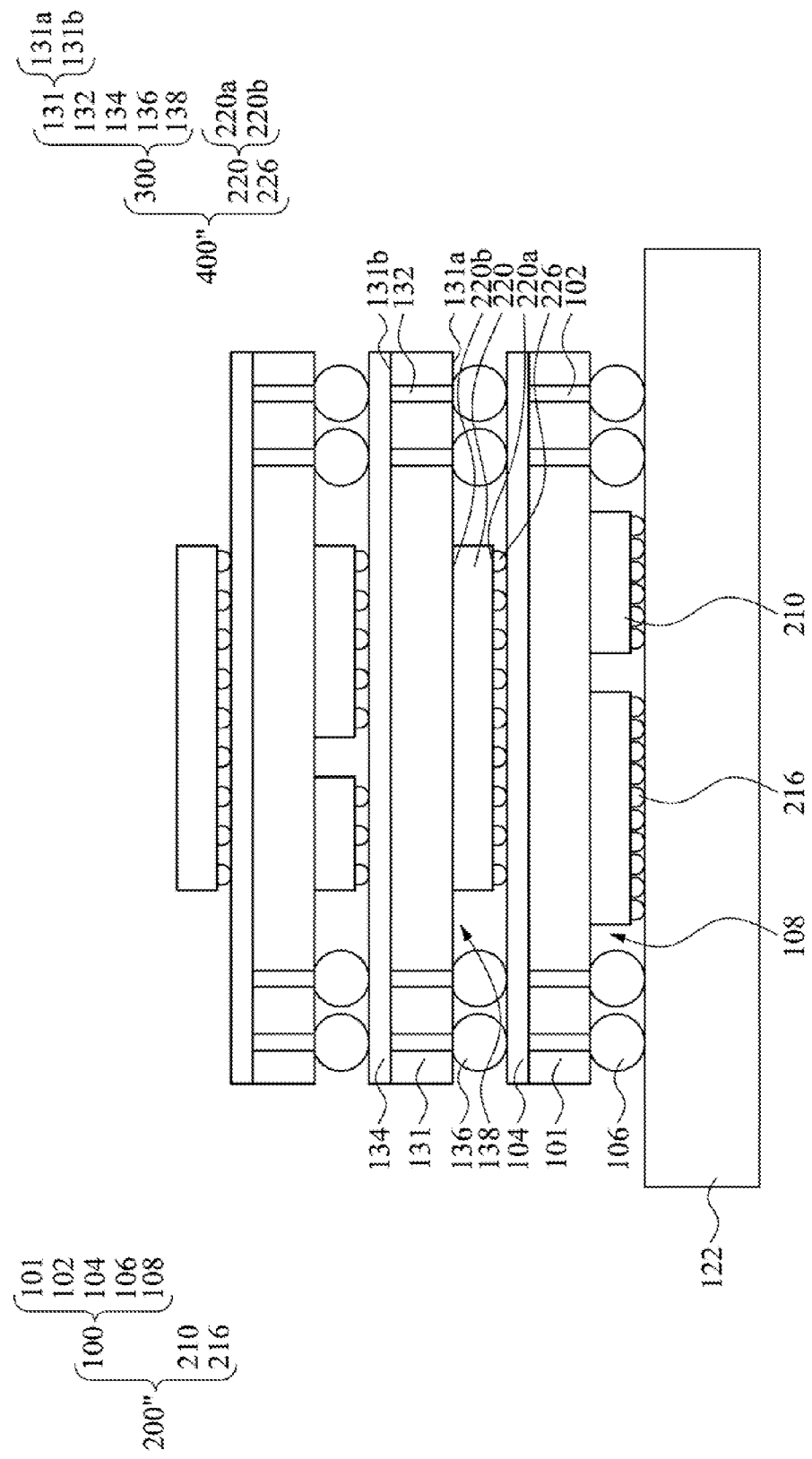

With reference to FIG. 13, the method 20 may further include forming a semiconductor structure 400" over the semiconductor structure 200". In some embodiments, the semiconductor structure 400" is the same as or similar in structure to the semiconductor structure 200". Further, the semiconductor structure 400" may be formed by the same method as forming the semiconductor structure 200". Briefly, the semiconductor structure 400" includes a second stacking interposer 300 and a second chip 220. The second stacking interposer 300 includes a second interposer 131, a plurality of second conductive pillars 132, a second redistribution layer 134, and a plurality of third bumps 136. To be specific, the second interposer 131 has a first surface 131a and a second surface 131b. The second conductive pillars 132 penetrate through the second interposer 131. The second redistribution layer 134 is formed on the second surface 131b of the second interposer 131. The third bumps 136 are disposed at the side of the first surface 131a of the second interposer 131 and electrically connected to the second conductive pillars 132, in which the first surface 131a of the second interposer 131 has a clearance region 138 where is free of the third bumps 136. The second chip 220 has a first surface 220a and a second surface 220b, and includes a plurality of fourth bumps 226 on the first surface 220a. Furthermore, the second surface 220b of the second chip 220 is fastened to the clearance region 138 of the first surface 131a of the second interposer 131, and the third bumps 136 of the second stacking interposer 300 and the fourth bumps 226 of the second chip 220 are bonded to the first redistribution layer 104 of the semiconductor structure 200". The second chip 220 may be the same as the chips 110, 120, 130, and/or 210 described hereinbefore.

In some embodiment, another semiconductor structure 200" may be stacked over the semiconductor structure 400".

According to another aspect of the present disclosure, a semiconductor structure is provided. FIG. 11 shows a semiconductor structure 200" according to some embodiments of the present disclosure. The semiconductor structure 200" includes a first stacking interposer 100, a first chip 210 and a plurality of second bumps 216. The first stacking interposer 100 includes a first interposer 101, a plurality of first conductive pillars 102, a plurality of first bumps 106, and a first redistribution layer 104. The first interposer 101 has a first surface 101a and a second surface 101b opposite thereto. The first conductive pillars 102 penetrate through the first interposer 101 from the first surface 101a to the second surface 101b. The first bumps 106 are disposed at the side of the first surface 101a of the first interposer 101 and electrically connected to the first conductive pillars 102. Further, the first surface 101a has a clearance region 108 where is free of the first bumps 106. The first redistribution layer 104 is disposed on the second surface 101b of the first interposer 101.

The first chip 210 has a first surface 210a and a second surface 210b, and the second surface 210b of the first chip 210 is fastened to the clearance region 108 of the first surface 101a of the first interposer 101. The second bumps 216 are disposed on the first surface 210a of the first chip 210. It is noted that the first chip 210 is free of any through via. More specifically, each of the first bumps 106 has a first bonding end 106a and each of the second bumps 216 has a second bonding end 216a. The first bonding ends 106a of the first bumps 106 are substantially leveled with the second bonding end 216a of the second bumps 216. In other words, the height of the first bump 106 substantially equals to a sum of the thickness of the first chip 210 and the height of the second bump 216.

FIG. 12 illustrates another semiconductor structure according to yet some embodiments of the present disclosure. The semiconductor structure depicted in FIG. 12 includes a carrier substrate 122 and a semiconductor structure 200" on the carrier substrate 122. To be specific, the first bumps 106 of the first stacking interposer 100 and the second bumps 216 of the first chip 210 are bonded to the carrier substrate 122. Furthermore, referring to FIG. 13, other semiconductor structures such as semiconductor structure 400" and/or other structures may be added to the structure depicted in FIG. 12.

As compared with conventional 3D stacking techniques, the chip of the semiconductor structure disclosed herein is free of any TSV so that the difficulties in fabricating the TSVs in the circuit area of the chip may be avoided. Further, conventional 3D stacking techniques requires bumps formed on opposite surfaces thereof, thereby leading to an increase in manufacturing cost. In contrast, according to the embodiments of the present disclosure, the semiconductor chip only requires bumps formed on a single surface, and therefore is cost-effective. Moreover, the semiconductor structures and method disclosed herein can achieve the same spatial utilization efficacy as the 3D stacking technology by using the process of 2.5D packaging technologies. In addition, as compared with traditional 2.5D packaging technologies, the embodiments disclosed herein may save more than 50 percent area of the carrier substrate.

Furthermore, according to the embodiments of the present disclosure, the pattern and the distribution of the conductive pillars in each interposer is the same, and therefore the interposers may serve as a universal unit and make manufacturing processes to be unified, namely, no more double side bumps are needed for cost-saving.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. A semiconductor structure, comprising:
 a first stacking interposer, comprising:

a first interposer having a first surface and a second surface opposite thereto;

a plurality of first conductive pillars penetrating through the first interposer from the first surface to the second surface;

a plurality of first bumps disposed at a side of the first surface of the first interposer and electrically connected to the first conductive pillars, wherein the first surface has a clearance region where is free of the first bumps and the clearance region is level with the side of the first surface;

a conductive pad extending on the first surface and bridging two adjacent ones of the first conductive pillars, wherein the conductive pad covers the two adjacent ones of the first conductive pillars and is interposed between the two adjacent ones of the first conductive pillars and one of the first bumps; and a first redistribution layer disposed on the second surface of the first interposer;

a first chip disposed over the first redistribution layer, wherein the first chip is aligned with the clearance region of the first surface of the first interposer in a direction perpendicular to the first surface; and a plurality of second bumps interconnecting the first redistribution layer with the first chip.

2. The semiconductor structure of claim 1, further comprising:

a carrier substrate on which the first bumps of the first stacking interposer are disposed;

a second chip disposed on the carrier substrate such that the second chip is between the carrier substrate and the first interposer, wherein the second chip is aligned with the clearance region of the first surface of the first interposer and a spacing is present between the clearance region and the second chip;

a plurality of third bumps interconnected second chip with the carrier substrate.

3. The semiconductor structure of claim 2, further comprising:

a second stacking interposer disposed over the first stacking interposer, and comprising:

a second interposer having a first surface and a second surface opposite thereto;

a plurality of second conductive pillars penetrating through the second interposer;

a plurality of fourth bumps disposed at a side of the first surface of the second interposer and interconnecting the first redistribution layer with the second conductive pillars; and a second redistribution layer disposed on the second surface of the second interposer; and a third chip disposed over the second redistribution layer, wherein the third chip is aligned with the clearance region of the first surface of the first interposer in the direction perpendicular to the first surface.

4. The semiconductor structure of claim 3, wherein the first and the second conductive pillars have a same distribution such that each of the first conductive pillars is aligned with each of the second conductive pillars in the direction perpendicular to the first surface of the first interposer.

5. The semiconductor structure of claim 1, wherein the one of the first bumps is equal-potentially electrically connected to the two adjacent ones of the first conductive pillars through the conductive pad.

6. A semiconductor structure, comprising:
a first stacking interposer, comprising:

a first interposer having a first surface and a second surface opposite thereto;

a plurality of first conductive pillars penetrating through the first interposer from the first surface to the second surface;

a plurality of first bumps disposed at a side of the first surface of the first interposer and electrically connected to the first conductive pillars, wherein the first surface has a clearance region where is free of the first bumps and the clearance region is level with the side of the first surface; and a first redistribution layer disposed on the second surface of the first interposer;

a first chip having a first surface and a second surface opposite thereto, the second surface of the first chip being fastened to the clearance region of the first surface of the first interposer, wherein the second surface of the first chip is between the first surface of the first chip and the first surface of the first interposer; and a plurality of second bumps disposed on the first surface of the first chip.

7. The semiconductor structure of claim 6, wherein each first bump has a first bonding end and each second bump has a second bonding end, and the first bonding ends of the first bumps are substantially leveled with the second bonding end of the second bumps.

8. The semiconductor structure of claim 6, wherein each first bump has a first height, each second bump has a second height, and the first chip has a thickness, wherein the first height of the first bump substantially equals to a sum of the thickness of the first chip and the second height of the second bump.

9. The semiconductor structure of claim 6, further comprising a carrier substrate, wherein the first bumps of the first stacking interposer and the second bumps are bonded to the carrier substrate.

10. The semiconductor structure of claim 6, further comprising:

a second stacking interposer disposed over the first stacking interposer, and comprising:

a second interposer having a first surface and a second surface opposite thereto;

a plurality of second conductive pillars penetrating through the second interposer;

a plurality of third bumps disposed at a side of the first surface of the second interposer and interconnecting the first redistribution layer with the second conductive pillars; and a second redistribution layer disposed on the second surface of the second interposer;

a second chip disposed on the first surface of the second interposer; and a plurality of fourth bumps disposed on the second chip, wherein the fourth bumps interconnect the second chip with the first redistribution layer of the first stacking interposer.

11. A method of forming a semiconductor structure, the method comprising:

forming a first stacking interposer, comprising steps of:

providing a first interposer having a first surface and a second surface;

forming a plurality of first conductive pillars penetrating through the first interposer from the first surface to the second surface;

forming a first redistribution layer on the second surface of the first interposer;

forming a plurality of first bumps at a side of the first surface of the first interposer and electrically connected to the first conductive pillars, wherein the first surface has a clearance region where is free of the first bumps and the clearance region is level with the side of the first surface; and forming a conductive pad extending on the first surface and bridging two adjacent ones of the first conductive pillars, wherein the conductive pad covers the two adjacent ones of the first conductive pillars and is interposed between the two adjacent ones of the first conductive pillars and one of the first bumps;

providing a first chip comprising a plurality of second bumps; and bonding the second bumps of the first chip to the first redistribution layer on the second surface of the first interposer, wherein the first chip is aligned with the clearance region of the first surface of the first interposer in a direction perpendicular to the first surface of the first interposer.

12. The semiconductor structure of claim 11, further comprising:

providing a precursor substrate comprising a carrier substrate, a second chip, and a plurality of third bumps interconnecting the second chip with the carrier substrate; and bonding the first bumps of the first stacking interposer to the carrier substrate such that the second chip is between the carrier substrate and the first interposer, wherein the second chip is aligned with the clearance region of the first surface of the first interposer and a spacing is present between the clearance region and the second chip.

13. The semiconductor structure of claim 11, further comprising:

forming a second stacking interposer, comprising steps of:
providing a second interposer having a first surface and a second surface;
forming a plurality of second conductive pillars penetrating through the second interposer;
forming a second redistribution layer on the second surface of the second interposer; and
forming a plurality of fourth bumps at a side of the first surface of the second interposer and electrically connected to the second conductive pillars;

disposing a third chip over the second redistribution layer, wherein the third chip is aligned with the clearance region of the first surface of the first interposer in the direction perpendicular to the first surface; and bonding the fourth bumps of the second stacking interposer to the first redistribution layer of the first stacking interposer.

14. The semiconductor structure of claim 13, wherein the first and second conductive pillars have a same distribution such that each of the first conductive pillars is aligned with each of the second conductive pillars in the direction perpendicular to the first surface of the first interposer.

15. The semiconductor structure of claim 11, wherein the clearance region is surrounded by the first bumps, and the first chip has an area that is less than an area of the clearance region.

16. A method of forming a semiconductor structure, the method comprising:

forming a first stacking interposer, comprising steps of:
providing a first interposer having a first surface and a second surface;
forming a plurality of first conductive pillars penetrating through the first interposer from the first surface to the second surface;
forming a first redistribution layer on the second surface of the first interposer; and
forming a plurality of first bumps at a side of the first surface of the first interposer and electrically connected to the first conductive pillars, wherein the first surface has a clearance region where is free of the first bumps and the clearance region is level with the side of the first surface;

providing a first chip comprising a first surface, a second surface opposite thereto, and a plurality of second bumps on the first surface of the first chip; and fastening the second surface of the first chip to the clearance region of the first surface of the first interposer, wherein the second surface of the first chip is between the first surface of the first chip and the first surface of the first interposer.

17. The semiconductor structure of claim 16, wherein each first bump has a first bonding end and each second bump has a second bonding end, and the first bonding ends of the first bumps are substantially leveled with the second bonding end of the second bumps.

18. The semiconductor structure of claim 16, further comprising: bonding the first bumps of the first stacking interposer and the second bumps of the first chip to a carrier substrate.

19. The semiconductor structure of claim 16, further comprising:

forming a second stacking interposer, comprising:
providing a second interposer having a first surface and a second surface;
forming a plurality of second conductive pillars penetrating through the second interposer;
forming a second redistribution layer on the second surface of the second interposer;
forming a plurality of third bumps at a side of the first surface of the second interposer and electrically connected to the second conductive pillars, wherein the first surface of the second interposer has a clearance region where is free of the third bumps; and providing a second chip comprising a first surface, a second surface opposite thereto, and a plurality of fourth bumps on the first surface of the second chip;

fastening the second surface of the second chip to the clearance region of the first surface of the second interposer; and bonding the third bumps of the second stacking interposer and the fourth bumps of the second chip to the first redistribution layer of the first stacking interposer.

20. The semiconductor structure of claim 16, further comprising forming a conductive pad extending on the first surface of the first interposer and bridging two adjacent ones of the first conductive pillars, after forming the first redistribution layer.

* * * * *